(12) United States Patent
Agarwal et al.

(10) Patent No.: US 9,106,251 B2
(45) Date of Patent: *Aug. 11, 2015

(54) DATA COMPRESSION UTILIZING LONGEST COMMON SUBSEQUENCE TEMPLATE

(71) Applicant: INTERNATIONAL BUSINESS MACHINES CORPORATION, Armonk, NY (US)

(72) Inventors: Kanak B. Agarwal, Austin, TX (US); Damir A. Jamsek, Austin, TX (US); Michael A. Paolini, Austin, TX (US); Robert B. Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

This patent is subject to a terminal disclaimer.

(21) Appl. No.: 13/780,735

(22) Filed: Feb. 28, 2013

(65) Prior Publication Data

US 2014/0049413 A1 Feb. 20, 2014

Related U.S. Application Data

(63) Continuation of application No. 13/587,669, filed on Aug. 16, 2012, now Pat. No. 8,674,856.

(51) Int. Cl.
*H03M 7/30* (2006.01)

(52) U.S. Cl.
CPC ............... *H03M 7/30* (2013.01); *H03M 7/607* (2013.01)

(58) Field of Classification Search
CPC .................. H04M 7/607; H04M 7/30

USPC .......................... 341/50, 51, 87, 158
See application file for complete search history.

(56) References Cited

U.S. PATENT DOCUMENTS

| | | | |
|---|---|---|---|
| 5,339,076 A | * | 8/1994 | Jiang ............................... 341/51 |
| 5,525,982 A | | 6/1996 | Cheng et al. |
| 5,704,060 A | | 12/1997 | Del Monte |
| 5,951,623 A | | 9/1999 | Reynar et al. |
| 5,977,889 A | | 11/1999 | Cohen |
| 5,977,890 A | | 11/1999 | Rigoutsos et al. |

(Continued)

OTHER PUBLICATIONS

U.S. Appl. No. 13/587,669 entitled "Data Compression Utilizing Longest Common Subsequence Template"; Notice of Allowance dated Oct. 31, 2013.

(Continued)

*Primary Examiner* — Jean B Jeanglaude
(74) *Attorney, Agent, or Firm* — Russell Ng PLLC; Steven Bennett

(57) ABSTRACT

In response to receipt of an input string, an attempt is made to identify, in a template store, a closely matching template for use as a compression template. In response to identification of a closely matching template that can be used as a compression template, the input string is compressed into a compressed string by reference to a longest common subsequence compression template. Compressing the input string includes encoding, in a compressed string, an identifier of the compression template, encoding substrings of the input string not having commonality with the compression template of at least a predetermined length as literals, and encoding substrings of the input string having commonality with the compression template of at least the predetermined length as a jump distance without reference to a base location in the compression template. The compressed string is then output.

8 Claims, 10 Drawing Sheets

(56) References Cited

U.S. PATENT DOCUMENTS

| | | |
|---|---|---|
| 6,281,816 B1 | 8/2001 | Kampf |
| 6,650,259 B1 | 11/2003 | Cooper |
| 7,180,433 B1 | 2/2007 | Grotmol |
| 2003/0212695 A1 | 11/2003 | Rissanen |
| 2008/0024350 A1 | 1/2008 | Srinivasan et al. |
| 2011/0285556 A1 | 11/2011 | Novy |

OTHER PUBLICATIONS

U.S. Appl. 13/587,669 entitled "Data Compression Utilizing Longest Common Subsequence Template"; Non-final office action dated Sep. 10, 2013.

S. Rigler, "FPGA-Based Lossless Data Compression Using GNU Zip", A thesis presented to the University of Waterloo in fulfilment of the thesis requirement for the degree of Master of Applied Science in Electrical and Computer Engineering, Jan. 20, 2007.

H. Tee, "FPGA unsolicited commercial email inline filter design using Levenshtein distance algorithm and longest common subsequence algorithm", Dissertation (M.C.S.)—Faculty of Computer Science & Information Technology, University of Malaya, Jun. 2010.

L. Bergroth et al., "A Survey of Longest Common Subsequence Algorithms", Department of Computer Science University of Turku, IEEE, pp. 39-48, Year: 2000.

M.C. Berntsen, "Automating the Cracking of Simple Ciphers", A Thesis Presented to the Faculty of Bucknell University in Partial Fulfillment of the Requirements for the Degree of Bachelor of Science with Honors in Computer Science, Apr. 19, 2005.

R. Nigel Horspool, "Improving LZW", Dept. of Computer Science, University of Victoria, Data Compression Conference, Apr. 8-11, 1991.

S.R. Kodituwakku et. al., "Comparison of Lossless Data Compression Algorithms for Text Data", Indian Journal of Computer Science and Engineering, vol. 1 No. 4 416-425, Year: 2010.

S. Rein et al.,"Compression of Short Text on Embedded Systems", Journal of Computers, vol. 1, No. 6, Sep. 2006.

E. Witteman, "Compression of DNA Sequences with Genetic Programming", Master's Thesis—Leiden Institute of Advanced Computer Science (LIACS) Leiden University, Jun. 2010.

T. Jansen et al., "Analysis of Evolutionary Algorithms for the Longest Common Subsequence Problem", London, England, United Kingdom, GECCO'07 Jul. 7-11, 2007.

* cited by examiner

DATA COMPRESSION UTILIZING LONGEST COMMON SUBSEQUENCE TEMPLATE

PRIORITY CLAIM

This application is a continuation of U.S. patent application Ser. No. 13/587,669 entitled "DATA COMPRESSION UTILIZING LONGEST COMMON SUBSEQUENCE TEMPLATE," filed on Aug. 16, 2012, the disclosure of which is incorporated herein by reference in its entirety for all purposes.

BACKGROUND OF THE INVENTION

The present invention relates to data processing, and more specifically, to data compression.

A data center of an enterprise may include numerous processing elements, data storage devices, network adapters, and other computational resources coupled to one or more internal and/or external data networks. The resources of the data center can be utilized to service many different types of workloads, including customer workloads, which may originate from clients of the enterprise, as well as organizational workloads, which support the business processes of the enterprise. Frequently, the processing of client and organizational workloads require the communication of a substantial volume of data and messages across the internal and/or external data networks of the data center, for example, to or from processing elements and/or data storage devices.

In data center environments, and more generally, in many data processing environments, network bandwidth is a scarce resource that limits the amount of useful work that can be performed utilizing the resources of the data processing environment. Consequently, a variety of techniques have been developed to reduce the bandwidth and storage requirements to store and/or communicate messages and/or data files.

These techniques include data compression, which represents data (e.g., a message or data file) in a more compact form than its original uncompressed form. Data compression techniques can be broadly classified as either lossy or lossless, depending on whether the original data can be decoded from the compressed data without any data loss. Although lossy compression can often achieve a greater compression ratio for certain types of data, the inherent loss of data generally limits its application to multimedia images, video, audio, and other data types for which such data loss is acceptable. For other data types, such as data files, executable files and application messages, such data loss is often unacceptable, and lossless compression techniques are therefore commonly employed. Common lossless compression techniques include run length encoding (RLE), arithmetic encoding, Huffman coding, dictionary-based encoding including Lempel-Ziv encoding and its variants (e.g., LZ77, LZ78, LZW (Lempel-Ziv-Welch), etc.), and delta encoding.

Delta encoding expresses data as differences between reference data and the data to be encoded. The differences between the reference data and the data to be encoded can then be stored or transmitted in lieu of the data to be encoded, where such differences are commonly referred to as "diffs" based on the name of the Unix® file comparison utility diff. Like the diff file comparison utility, delta encoding techniques are commonly based on detection of the longest common subsequence between the reference data and the data to be encoded. The term "longest common subsequence," which refers to commonality between sequential portions of a dataset and reference data regardless of whether the matching portions are consecutive, should not be confused with the similar term "longest common substring," which refers to commonality between consecutive sequential portions of a dataset and reference data. Thus, a "substring" of a string is always a subsequence of the string, but a "subsequence" of the string is not always a sub string of the string.

BRIEF SUMMARY

In some embodiments, available network bandwidth and/or storage capacity in a data processing environment is improved through data compression.

In at least one embodiment, in response to receiving an input string to be compressed, a plurality of diverse lossless compression techniques are applied to the input string to obtain a plurality of compressed strings. The plurality of diverse lossless compression techniques include a template-based compression technique and a non-template-based compression technique. A most compressed string among the plurality of compressed strings is selected. A determination is made regarding whether or not the most compressed string was obtained by application of the template-based compression technique. In response to determining that the most compressed string was obtained by application of the template-based compression technique, the most compressed string is compressed utilizing the non-template-based compression technique to obtain an output string. In response to determining that the most compressed string was not obtained by application of the template-based compression technique, the most compressed string is output as the output string.

In at least one embodiment, in response to receipt of an input string, an attempt is made to identify, in a template store, a closely matching template for use as a compression template. In response to identification of a closely matching template that can be used as a compression template, the input string is compressed by reference to a longest common subsequence compression template. Compressing the input string includes encoding, in a compressed string, an identifier of the compression template, encoding substrings of the input string not having commonality with the compression template of at least a predetermined length as literals, and encoding substrings of the input string having commonality with the compression template of at least the predetermined length as a jump distance without reference to a base location in the compression template. The compressed string is then output.

DETAILED DESCRIPTION

Figure 1:
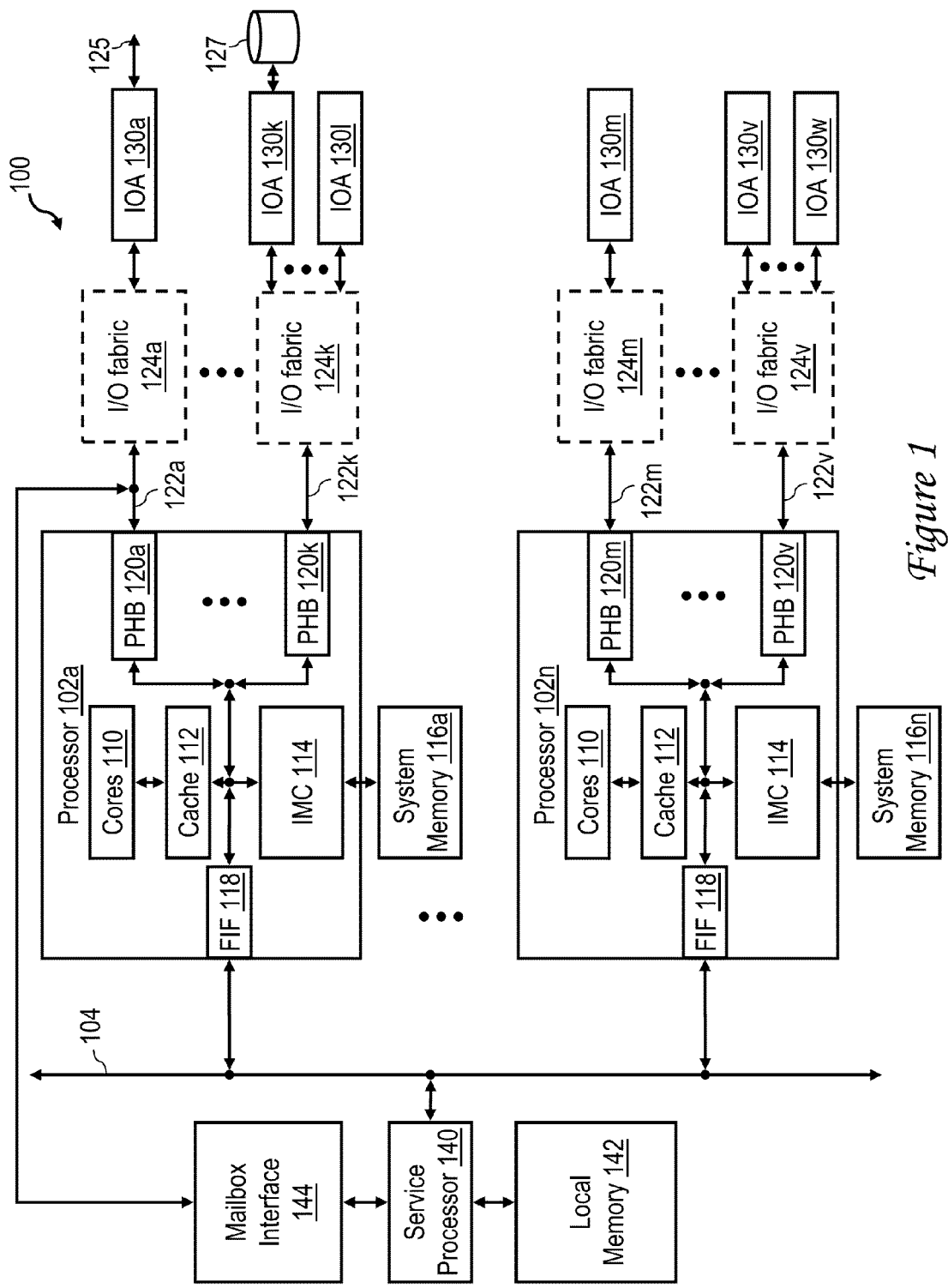
FIG. 1 is a high level block diagram of a data processing environment in accordance with one embodiment.

With reference now to the figures, and in particular with reference to FIG. 1, there is depicted a high level block diagram of an exemplary data processing system 100 in accordance with one embodiment. In some embodiments, data processing system 100 may be, for example, a symmetric multiprocessor (SMP) system including a plurality of processors 102a-102n, each coupled for communication to a system fabric 104, which may include one or more bused, switched and/or wireless communication links. For example, data processing system 100 may be implemented with an IBM eServer, a product line of International Business Machines Corporation of Armonk, N.Y. In alternative embodiments, a data processing system with a single processor 102 may be utilized.

In the depicted embodiment, each processor 102 is preferably realized as a single integrated circuit chip having a substrate in which semiconductor circuitry is fabricated as is known in the art. As shown, processor 102 includes a plurality of processor cores 110 that process data through the execution and/or processing of program code, which may include, for example, software and/or firmware and associated data, if any. Processor 102 further includes cache memory 112 providing one or more levels of relatively low latency temporary storage for instructions and data retrieved from lower levels of the data storage hierarchy. In addition, processor 102 includes an integrated memory controller 114 that controls access to an associated one of off-chip system memories 116.

Each processor 102 further includes a fabric interface (FIF) by which processor 102 communicates with system fabric 104, as well as one or more (and preferably multiple) host bridges supporting input/output communication with various input/output adapters (IOAs) 130. In the depicted embodiment, all of the host bridges are implemented as Peripheral Component Interconnect (PCI) host bridges (PHBs) 120, but in other embodiments the host bridges may implement one or more additional or alternative I/O bus standards.

PHBs 120a, 120k, 120m and 120v provide interfaces to PCI local buses 122a, 122k, 122m and 122v, respectively, to which IOAs 130, such as network adapters, storage device controllers, peripheral adapters, etc., may be directly connected or indirectly coupled. For example, PCI IOA 130a, which is network adapter coupled to data network 125, is coupled to PCI local bus 122a optionally through an I/O fabric 124a, which may comprise one or more switches and/or bridges. In a similar manner, PCI IOA 1301 and PCI IOA 130k, which is a storage device controller that controls storage device 127, are coupled to PCI local bus 122k optionally through an I/O fabric 124k, PCI IOA 130m is coupled to PCI local bus 122m optionally through I/O fabric 124m, and PCI IOAs 130v and 130w, which may comprise, for example, a display adapter and hard disk adapter, are coupled to PCI local bus 122v optionally through I/O fabric 124v.

Data processing system 100 further includes a service processor 140 that manages the boot process of data processing system 100 and thereafter monitors and reports on the performance of and error conditions detected in data processing system 100. Service processor 140 is coupled to system fabric 104 and is supported by a local memory 142, which may include volatile (e.g., dynamic random access memory (DRAM)) and non-volatile memory (e.g., non-volatile random access memory (NVRAM) or static random access memory (SRAM)). Service processor 140 is further coupled to a mailbox interface 144 through which service processor 140 communicates I/O operations with PCI bus 122a.

Those of ordinary skill in the art will appreciate that the architecture and components of a data processing system can vary between embodiments. For example, other devices and interconnects may alternatively or additionally be used. Accordingly, the exemplary data processing system 100 given in FIG. 1 is not meant to imply architectural limitations with respect to the claimed invention.

Figure 2:
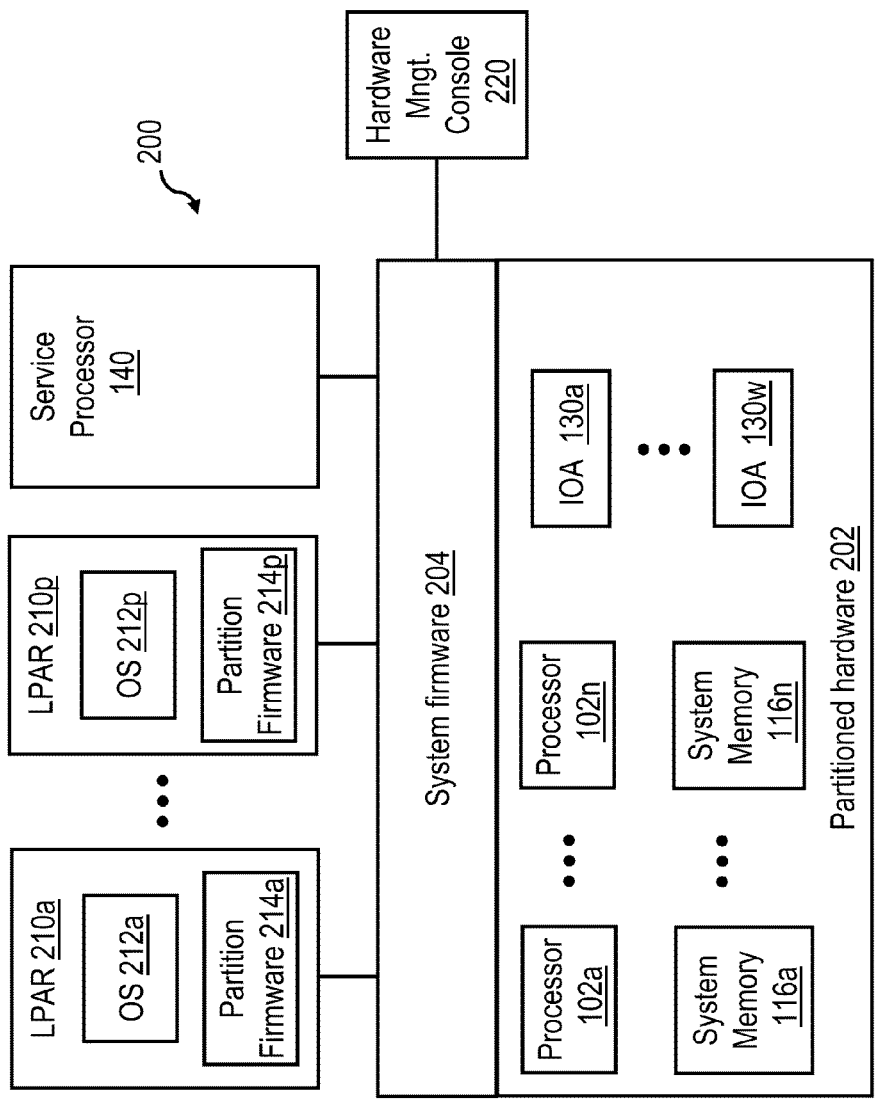
FIG. 2 is a logical view of a data processing system showing the hardware and software resources of the data processing system partitioned into multiple concurrently executing logical partitions (LPARs)

Referring now to FIG. 2, there is depicted a logical view of a data processing system 200 showing the hardware and software resources of the data processing system partitioned into multiple logical partitions (LPARs). Data processing system 200 may have, for example, the same components and/or architecture as data processing system 100 in FIG. 1 and accordingly identifies common components with like reference numerals.

Data processing system 200 has a collection of partitioned hardware 202, including processors 102a-102n, system memories 116a-116n and IOAs 130a-130w. Partitioned hardware 202 may of course include additional unillustrated components, such as additional volatile or nonvolatile storage devices, ports, bridges, switches, etc. The hardware components comprising partitioned hardware 202 (or portions thereof) can be assigned to various ones of logical partitions (LPARs) 210a-210p in data processing system 200 by system firmware 204, also referred to herein as a virtual machine monitor (VMM) or hypervisor. System firmware 204 supports the simultaneous execution of multiple independent operating system instances by virtualizing the partitioned hardware 202 of data processing system 200.

In addition to the hardware resources allocated by system firmware 204, each of LPARs 210a-210p includes a respective one of multiple concurrently executed operating system instances 212a-212p. In various embodiments, operating system instances 212a-212p, which may include, for example, instances of Linux, AIX and/or Windows, may be homogeneous or heterogeneous. Each LPAR 210 may further include unillustrated application programs, as well as a respective instance of partition firmware 214, which may be implemented, for example, with a combination of initial boot strap code, IEEE-1275 Standard Open Firmware, and runtime abstraction software (RTAS). When LPARs 210a-210p are instantiated, a copy of boot strap code is loaded onto partitions 210a-210p by system firmware 204. Thereafter, system firmware 204 transfers control to the boot strap code, which in turn loads the open firmware and RTAS. The processor(s) 102 assigned to each LPAR 210 then execute the partition firmware 214 of that LPAR 210 to bring up the LPAR 210 and initiate execution of the OS instance 212.

In the logically partitioned environment depicted in FIG. 2, service processor 140 can be used to provide various services, such as processing of errors in LPARs 210a-210p. These services may also function as a service agent to report errors back to a system administrator or vendor of data processing system 200. Operation of the different LPARs 210 may further be controlled through a hardware management console 220. In at least one embodiment, hardware management console 220 can be implemented as a separate data processing system from which a system administrator may perform various functions within data processing system 200 including creating and destroying LPARs 210, as well as reallocating hardware and software resources among LPARs 210.

In a logical partitioned environment such as that depicted in FIG. 2, it is not permissible for the hardware or software resources in one LPAR 210 to consume the resources of or affect the operations in another LPAR 210. Furthermore, to be useful, the assignment of resources to LPARs 210 needs to be fine-grained. For example, it is often not acceptable to assign all IOAs 130 under a particular PHB 120 to the same partition, as that will restrict configurability of the system, including the ability to dynamically reallocated resources between partitions. Accordingly, PHBs 120 are able to assign resources, such as individual IOAs 130 (or portions thereof) to different LPARs 210 while preventing the assigned resources from accessing or affecting the resources of other LPARs 210.

Figure 3:
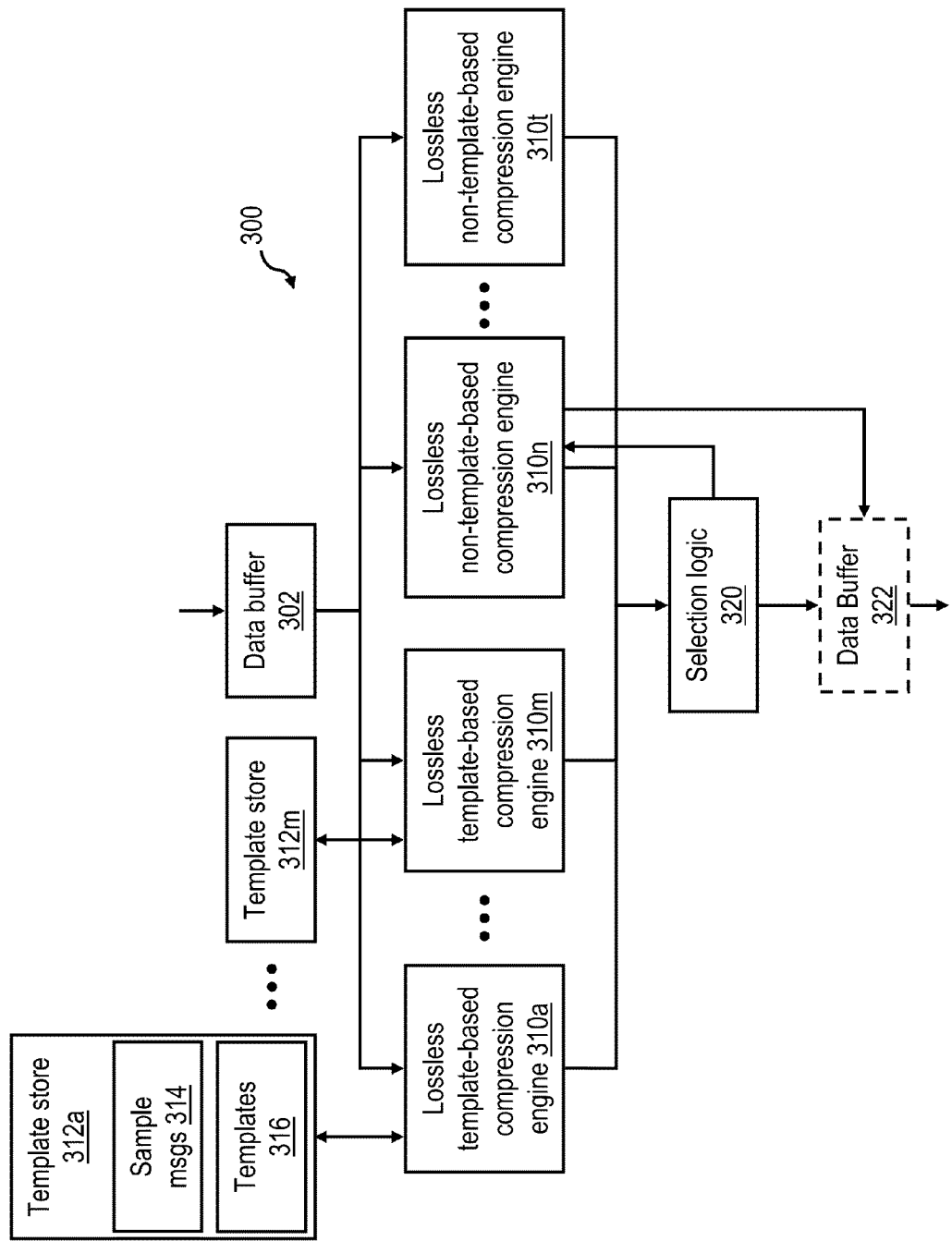
FIG. 3 is a block diagram of a data compressor in accordance with one embodiment.

With reference now to FIG. 3, there is illustrated a block diagram of a data compressor 300 in accordance with one embodiment. In one preferred embodiment, data compressor 300, which preferably compresses data prior to storing and/or transmitting the data, is implemented in one or more of processors 102, for example, in PHB 120, and/or in one or more of IOAs 130. By compressing the data prior to storage and/or transmission, data compressor 300 reduces the network bandwidth requirements (e.g., on system fabric 104, local bus 122, or data network 125) and/or storage requirements (e.g., in data storage device 127) for the compressed data. In at least some embodiments, data compressor 300 is implemented in hardware, for example, in the integrated circuitry of processor 102 or IOA 130, or in an associated ASIC (application specific integrated circuit), or in a FPGA (Field Programmable Gate Array). In other embodiments, data compressor 300 can be implemented utilizing firmware or software.

As shown, data compressor 300 includes an input data buffer 302 that receives and buffers data to be compressed, referred to herein as an input string. The string includes a sequence of a plurality of characters. In cases in which the string to be compressed is a text message, the text message may be expressed, for example, in a markup language (e.g., Hypertext Markup Language (HTML) or eXtensible Markup Language (XML)). Data buffer 302 is coupled to provide the input string to a plurality of lossless compression engines 310a-310t that operate in parallel to generate a corresponding plurality of compressed strings corresponding to the input string. Thus, each of lossless compression engines 310 produces its own respective compressed string rather than working in parallel to produce a single compressed string. As shown, lossless compression engines 310 employ diverse compression techniques, with one or more of lossless compression engines 310 (e.g., lossless compression engines 310a-310m) employing lossless template-based compression techniques, and one or more of lossless compression engines 310 (e.g., lossless compression engines 310n-310t) employing lossless non-template-based compression techniques. For example, lossless template-based compression engines 310a-310m, which are each coupled to a respective template store 312a-312m, may employ variants of longest common substring compression and/or longest common subsequence compression. Lossless non-template-based compression engines 310n-310t, on the other hand, may employ run length encoding (RLE), arithmetic encoding, Huffman coding, and/or dictionary-based encoding. It should be noted that such dictionary-based encoding differs from template-based encoding in that dictionary-based encoding techniques generally represent each symbol (e.g., ASCII character) in the input string by its own respective dictionary-supplied code and achieve compression by reducing the size of the corresponding dictionary code as compared to the original symbol and by compact encoding of repetitions of the symbol. Template-based encoding, in contrast, attempts to use differential encoding to encode strings in terms of differences from templates that include sequences of multiple symbols.

Data compressor 300 further includes selection logic 320 coupled to the plurality of lossless compression engines 310a-310t to receive the plurality of compressed strings produced by lossless compression engines 310a-310t. Selection logic 320 selects the most compact of the compressed strings, and if produced by one of lossless template-based compression engines 310a-310m, recompresses the compressed string utilizing one of lossless non-template-based compression engines 310a-310t. Data compressor 300 may further include an output data buffer 322 that outputs the singly or doubly compressed string, for example, for transmission (e.g., on system fabric 104, a local bus 122, or data network 125) or for storage (e.g., in data storage device 127).

It should be appreciated that in at least some embodiments the data compression implemented by data compressor 300 can be utilized in combination with one or more additional data security or bandwidth enhancement measures. For example, the described data compression can also be implemented in combination with data de-duplication and/or data encryption, for both data communicated within data processing system 100 and data communicated outside of data processing 100.

Figure 4:
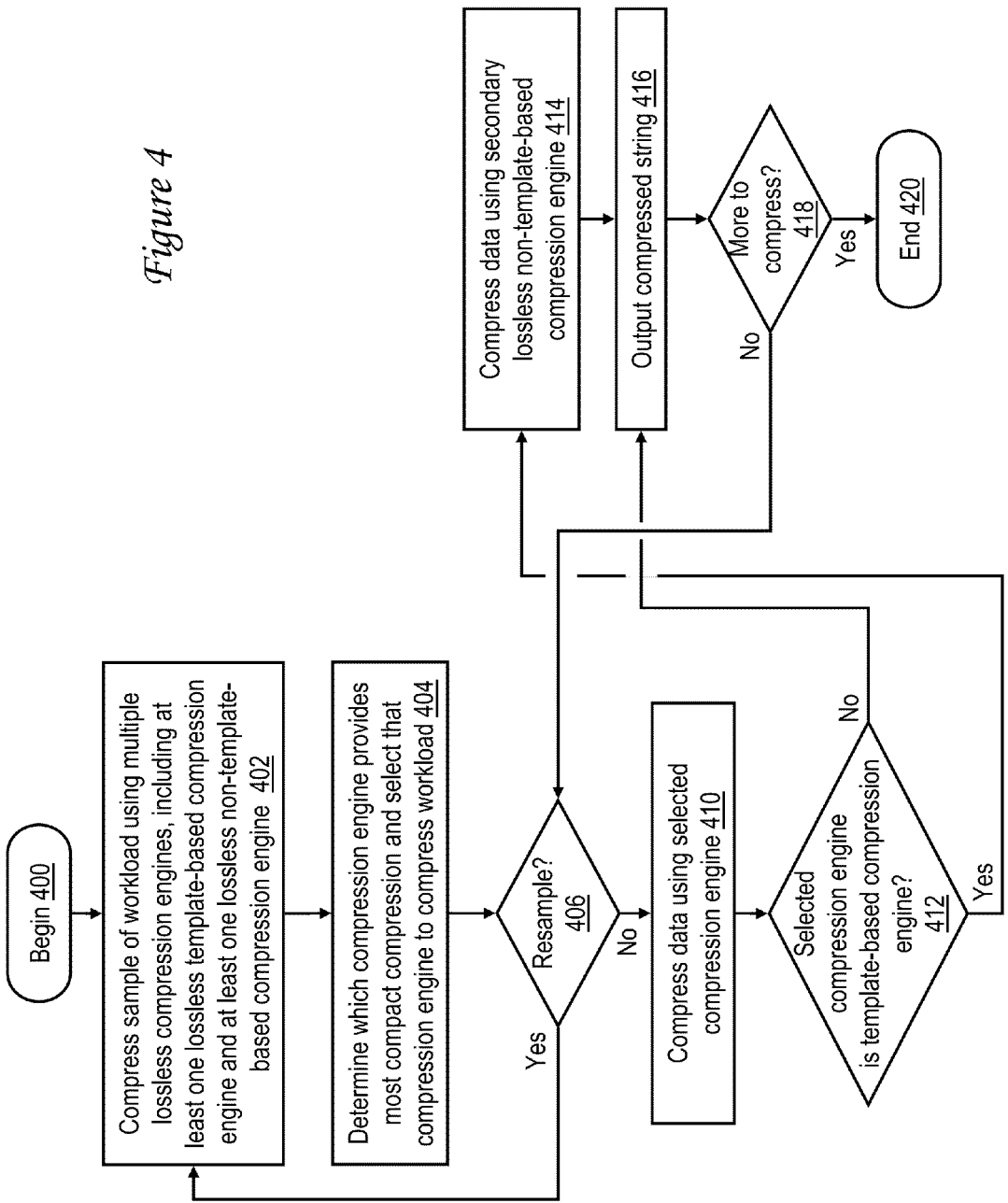
FIG. 4 is a high level logical flowchart of an exemplary process by which the data compressor of FIG. 3 compresses data.

Referring now to FIG. 4, there is depicted a high level logical flowchart of an exemplary process by which the data compressor 300 of FIG. 3 compresses data. The process begins at block 400 and then proceeds to block 402, which illustrates data compressor 300 compressing a sample of a workload (e.g., one or more initial XML application messages of a network session) in parallel using multiple lossless compression engines 310, including at least one lossless template-based compression engine 310a-310m and at least one lossless non-template-based compression engine 310n-310t. At block 404, selection logic 320 compares the multiple compressed strings generated by the loss compression engines 310 and selects the lossless compression engine 310 providing the most compact compressed strings as the lossless compression engine 310 to be used for the workload.

Data compressor 300 determines at block 406 whether or not to resample the workload, for example, in response to initiation of a new communication session and/or detection of a change in the characteristic of the input strings to be compressed and/or detection of degradation of the compression ratio being achieved by the selected compression technique. In response to a determination to resample the workload, data compressor 300 again samples the workload, as discussed above with reference to block 402. In response to a negative determination at block 406, data compressor 300 compresses input strings in the workload utilizing the lossless compression engine 310 selected at block 404 (block 410). As indicated at block 412-414, if the selected lossless compression engine 310 is one of lossless template-based compression engines 310a-310m, then selection logic 320 causes the compressed string obtained from the selected one of lossless template-based compression engines 310a-310m to be recompressed by one of lossless non-template-based compression engines 310n-310t. Data compressor 300 thereafter outputs the compressed string obtained following block 412 or block 414 for storage and/or transmission (block 416). As indicated at block 418, if the workload includes additional strings to compress, the process returns to block 406, which has been described. Otherwise, the process given in FIG. 4 terminates at block 420.

Figure 5:
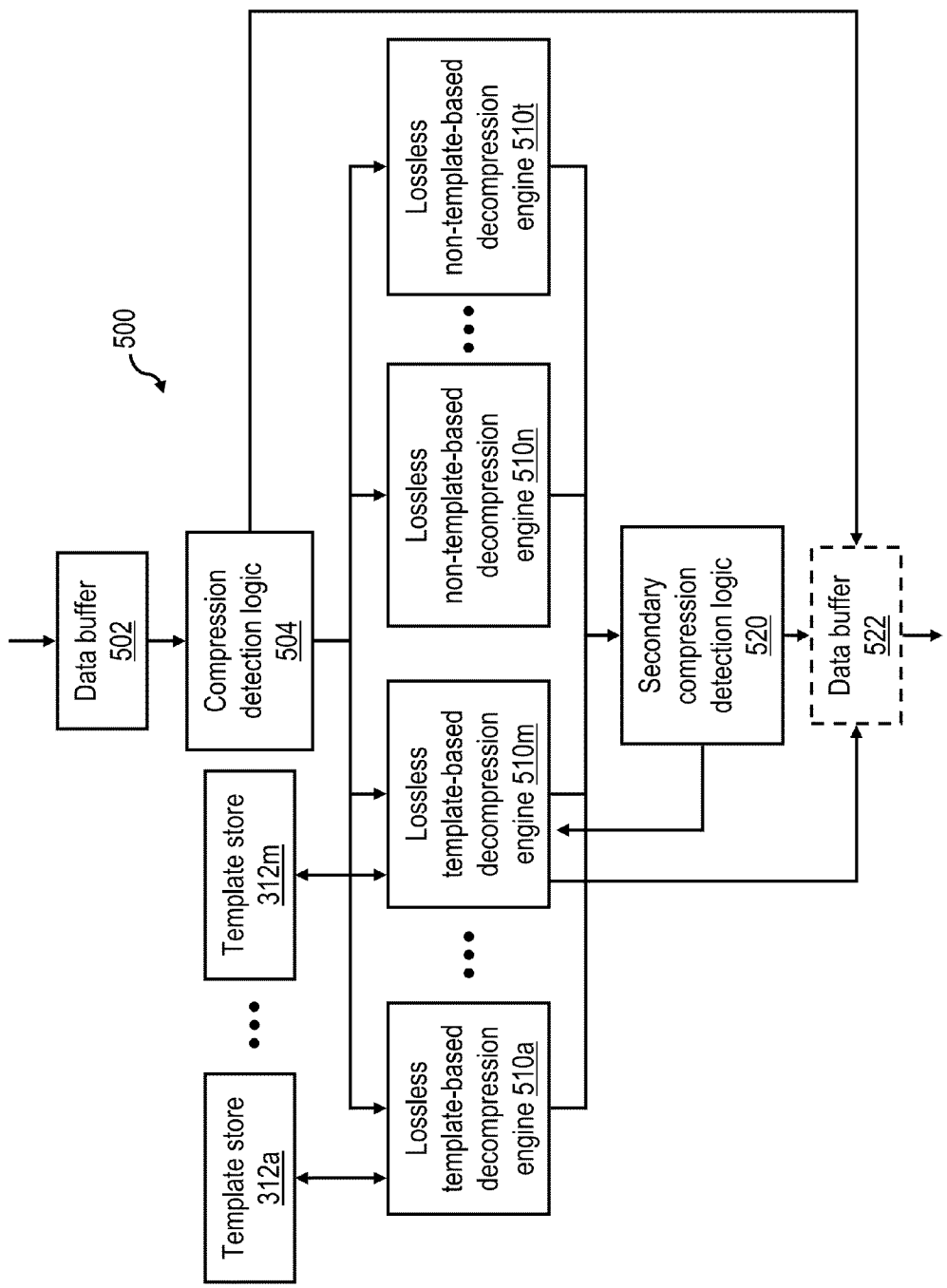
FIG. 5 is a block diagram of a data decompressor in accordance with one embodiment.

With reference now to FIG. 5, there is illustrated a block diagram of a data decompressor 500 in accordance with one embodiment. In one preferred embodiment, data decompressor 500, which preferably decompresses data after retrieval from data storage and/or receipt of a transmission of the data, is implemented in one or more of processors 102, for example, in PHB 120, and/or in one or more of IOAs 130. In at least some embodiments, data decompressor 500 is implemented in hardware, for example, in the integrated circuitry of processor 102 or IOA 130, or in an associated ASIC (application specific integrated circuit), or in a FPGA (Field Programmable Gate Array). In other embodiments, data decompressor 500 can be implemented utilizing firmware or software.

As shown, data decompressor 500 includes an input data buffer 502 that receives and buffers data to be decompressed, for example, a compressed string output by an instance of data compressor 300. Data buffer 502 is coupled to provide the input string to compression detection logic 504, which detects a lossless compression technique utilized to compress the data, for example, by examining a header portion of a compressed string. Compression detection logic 504 is coupled to provide the compressed string to the appropriate one of a plurality of lossless decompression engines 510a-510t, which are each capable of applying a respective lossless decompression technique to generate a decompressed string corresponding to a compressed string generated by the corresponding lossless compression technique. As shown, lossless decompression engines 510a-510t employ diverse compression techniques, with one or more of lossless decompression engines 510 (e.g., lossless decompression engines 510a-510m) employing lossless template-based decompression techniques, and one or more of lossless compression engines 510 (e.g., lossless decompression engines 510n-510t) employing lossless non-template-based compression techniques. For example, lossless template-based decompression engines 510a-510m, which are each coupled to a respective template store 312a-312m (and which may be shared with those of a data compressor 300), may employ variants of longest common substring decompression and/or longest common subsequence decompression. Lossless non-template-based decompression engines 510n-510t, on the other hand, may decompress strings utilizing run length encoding (RLE), arithmetic encoding, Huffman coding, and/or dictionary-based encoding techniques.

Data decompressor 500 further includes secondary compression detection logic 520 coupled to the plurality of lossless decompression engines 510a-510t to receive the decompressed string produced by the selected one of lossless decompression engines 510a-510t. Secondary compression detection logic 520 detects whether the compressed string was doubly compressed, that is, compressed with both a lossless template-based compression technique and a lossless non-template-based technique. If so, secondary compression detection logic 520 causes the decompressed string received from one of lossless decompression engines 510 to be decompressed again utilizing the relevant one of lossless template-based decompression engines 510a-510m. Data decompressor 500 may further include an output data buffer 522 that outputs the singly or doubly decompressed string, for example, for further processing (e.g., by a consuming application instance) or for presentation.

Figure 6:
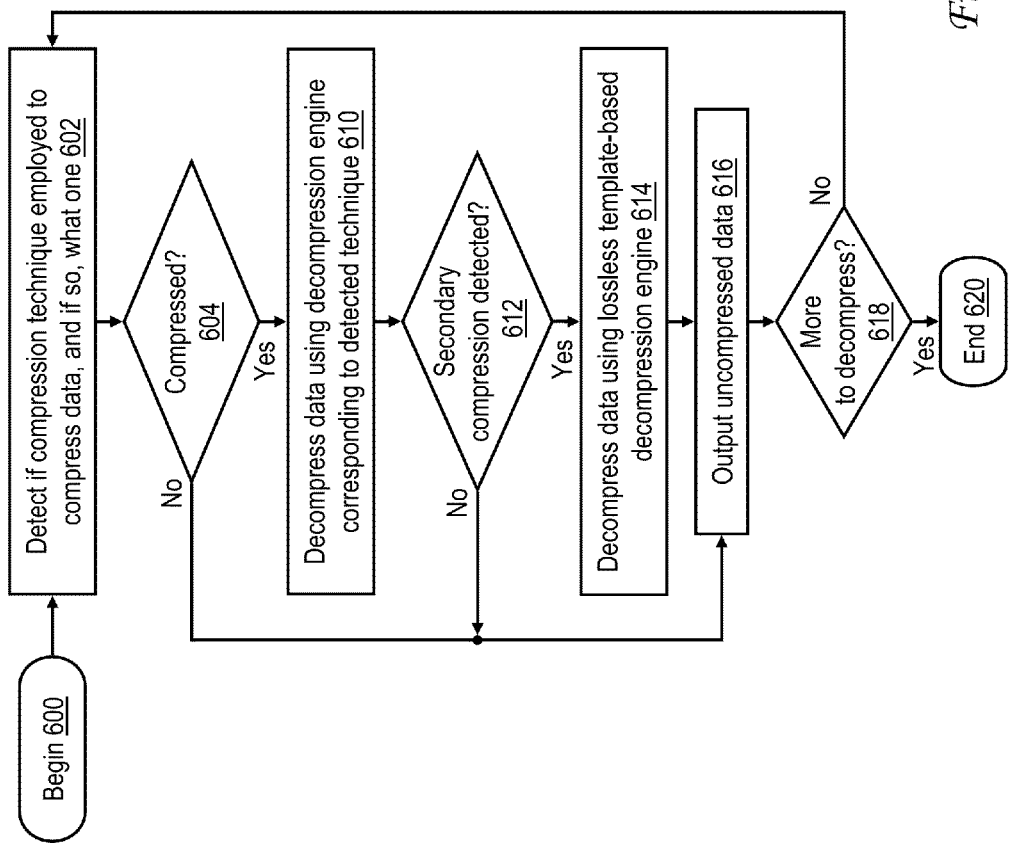
FIG. 6 is a high level logical flowchart of an exemplary process by which the data decompressor of FIG. 5 decompresses data.

Referring now to FIG. 6, there is a high level logical flowchart of an exemplary process by which data decompressor 500 of FIG. 5 decompresses data. The process begins at block 600, for example, in response to receipt of a data string in data buffer 502. The process then proceeds to block 602, which depicts compression detection logic 504 detecting if a compression technique was employed to compress the data string, and if so, which technique. For example, if the data string is a message, compression detection logic 504 may detect the presence of a compression technique by examining the header of the message. In response to a determination that the data string is uncompressed, the process passes directly to block 616, which illustrates compression detection logic 504 causing the data string to be output (e.g., via output data buffer 522) without further processing. Thereafter, the process passes to block 618, which is described below.

Referring again to block 604, in response to a determination that the data string is compressed, compression detection logic 504 directs the data string to the appropriate one of lossless decompression engines 510a-510t for decompression to obtain a decompressed string (block 610). Secondary compression detection logic 520 then detects whether or not the decompressed string is itself compressed, that is, whether a compression engine 300 doubly compressed the string, as described above with reference to blocks 410 and 414. If not, the process of FIG. 6 passes to block 616, which is described below. If, however, secondary compression detection logic 520 detects that the data string was doubly compressed, secondary compression detection logic 520 directs the further decompression of the string utilizing the appropriate one of lossless template-based decompression engines 510a-510m (block 614). After the data string is fully decompressed, data decompressor 500 outputs the uncompressed string, optionally via output data buffer 522 (block 616). As indicated at block 618, if the workload includes additional strings to decompress, the process returns to block 602, which has been described. Otherwise, the process given in FIG. 6 terminates at block 620.

Figure 7:
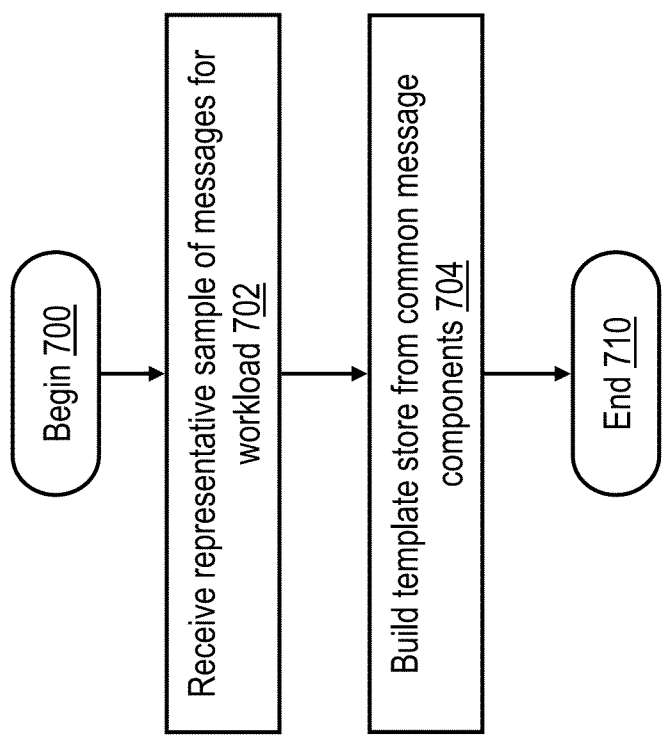
FIG. 7 is a high level logical flowchart of an exemplary process by which a data compression engine builds a template store in one embodiment.

With reference now to FIG. 7, there is illustrated a high level logical flowchart of an exemplary process by which a lossless template-based data compression engine (hereafter assumed to be lossless template-based compression engine 310a of FIG. 3) builds a template store 312 in one embodiment. The illustrated process begins at block 700, preferably prior to use of lossless template-based compression engines 310a to compress messages of an actual workload of data processing system 100. For example, the process given in FIG. 7 can be performed during a initialization phase of operation of data processing system 100 in which, following system boot, the components of data processing system 100 are configured to optimize performance of data processing system 100 for its expected workloads.

At block 702, lossless template-based compression engine 310a receives a set of representative sample messages 314 (see FIG. 3) for an anticipated workload. These sample messages can be, for example, application layer text (e.g., HTTP or XML) messages, which typically comprise a message header and a message body. In many cases, the sample messages have at least highly similar message headers, and may have similar message bodies. At block 704, lossless template-based compression engine 310a builds its corresponding template store 312a by storing multiple templates 316 each specifying at least one message component similar to that found in multiple of the sample messages 314. Lossless template-based compression engine 310a preferably creates at least one respective template 316 for each of multiple different message types by extracting the longest common subsequence of a sufficiently sized set of representative sample messages 314 of that message type. Of the resulting templates 316, one template 316 may include only a message header similar to that of multiple of the sample messages; another template 316 many include only a message body similar to that of multiple of the sample messages; yet another template 316 may include both a message header and a message body similar to that of multiple of the sample messages. Depending on implementation, multiple of the templates 316 may also contain common message components, with some of these templates having larger overall sizes than others. Such an arrangement allows lossless template-based compression engine 310*a* to select for use in compression the largest template 316 similar to a message to be compressed. Following block 704, the process shown in FIG. 7 ends at block 710.

Figure 8:
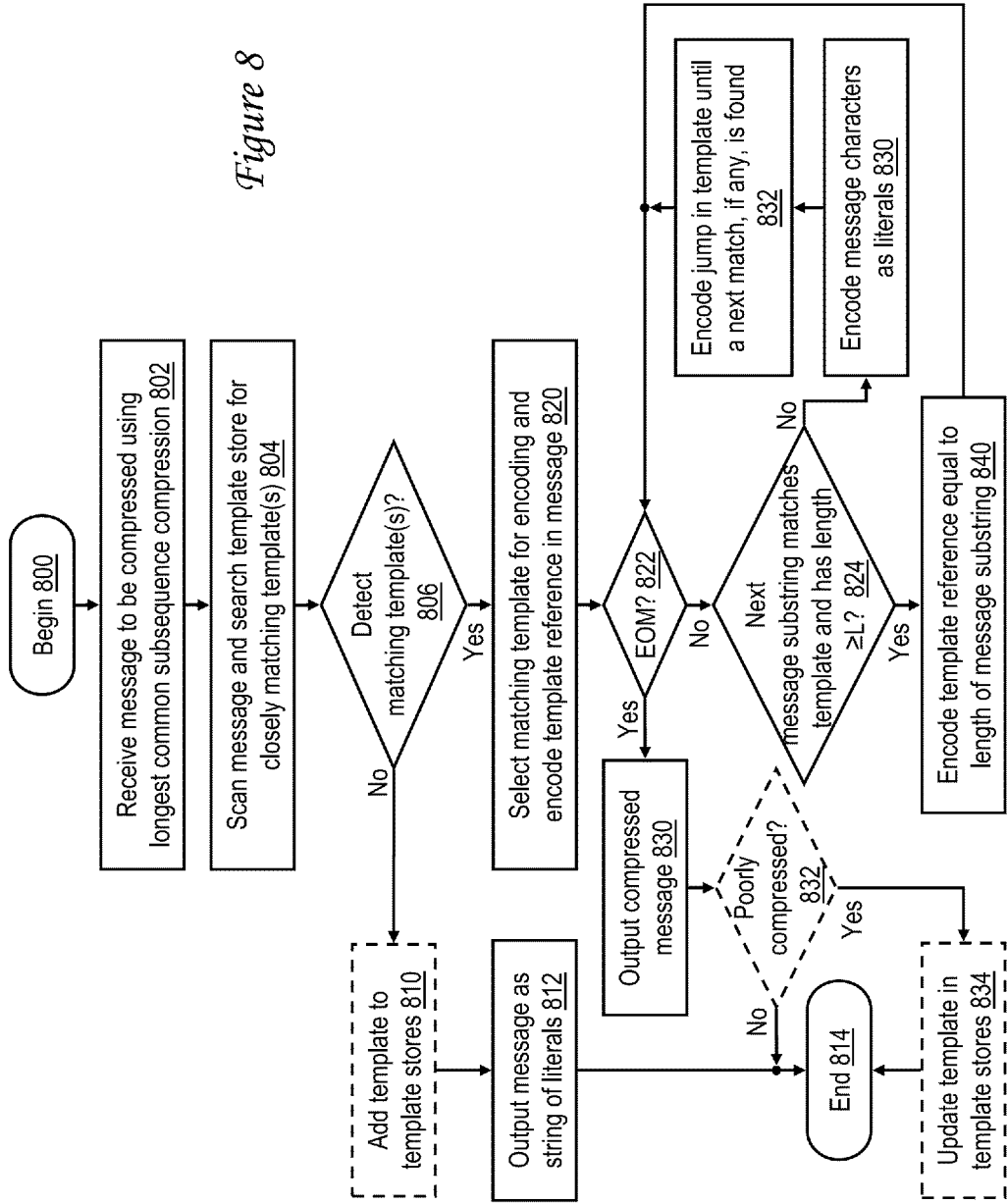
FIG. 8 is a high level logical flowchart of an exemplary process by which a lossless template-based data compression engine compresses data in one embodiment.

Referring now to FIG. 8, there is depicted a high level logical flowchart of an exemplary process by which a lossless template-based data compression engine (e.g., lossless template-based compression engine 310*a*) compresses string data in one embodiment. The process begins at block 800 and then proceeds to block 802, which depicts lossless template-based compression engine 310*a* receiving a message to be compressed. In the embodiment of FIG. 3, the same message is received for compression substantially concurrently by all of lossless compression engines 310*a*-310*t*. In other embodiments, the disclosed lossless template-based data compression engine may be utilized alone.

At block 804, lossless template-based compression engine 310*a* scans the input message and searches its template store 312*a* for one or more closely matching templates 316. In some embodiments, it may not be possible (e.g., for performance or other considerations) to scan the entire input message to find a closely matching template 316. In such embodiments, header information identifying the message type and/or additional sideband information can be used to select from template store 312*a* one or more candidate templates 316 to be used to encode the input message. At block 806, lossless template-based compression engine 310*a* determines whether or not at least one template 316 that closely matches the input message was found in template store 312*a*. If not, lossless template-based compression engine 310*a* optionally utilizes the input message to dynamically create a new template 316 in template stores 312*a* (block 810). For example, if the input message does not belong to any existing template category in template store 312*a*, lossless template-based compression engine 310*a* may form a new template category in template store 312*a* based on the message type of the input message and add the input message to a new set of sample messages 314 for the new template category. Once lossless template-based compression engine 310*a* has collected sufficient sample messages 314 of that message type, lossless template-based compression engine 310*a* can add a template 316 for the new template category to its template store 312*a* by extracting the longest common subsequence from the set of sample messages 314 in the new template category. If, however, the input message is unique or lossless template-based compression engine 310*a* has collected only a small number of sample messages 314 of that message type, lossless template-based compression engine 310*a* preferably does not create a template 316 for the message type in template store 312*a*. Any template 316 added to template store 312*a* is also preferably synchronized with one or more other template stores 312*a* to permit corresponding lossless template-based decompression engines 510*a* of data decompressors 500 to decode future input messages encoded by reference to the newly added template 316. At block 812, lossless template-based compression engine 310*a* outputs the uncompressed message as a string of literals. Thereafter, the process of FIG. 8 ends at block 814.

It should be noted that in at least one alternative embodiment, the input message is always compressed with respect to a template 316 in template store 312*a*, meaning that in such embodiments blocks 806-812 are omitted. Such an alternative embodiment is possible because, as described below, even a complete mismatch between the input message and the template 316 selected to perform the compression will not cause any error and will simply result in the input message being output as a string of literals, as described at block 812. In these alternative embodiment, a template 316 in template stores 312*a* can be specially designated as a default or "fallback" template to be employed if no other template 316 closely matching the input message is found in template store 312*a*.

Returning to block 806, in response to lossless template-based compression engine 310*a* determining that it has detected at least one template 316 in template store 312 that closely matches the input message, lossless template-based compression engine 310*a* selects the largest or most closely matching template 316 from template store 312*a* for use in compressing the input message and encodes a reference to that template in the output message (e.g., in a header portion of the output message) (block 820). Lossless template-based compression engine 310*a* then tests at block 822 whether or not the end of the input message to be compressed has been reached. If not, lossless template-based compression engine 310*a* serially scans the input message and the template 316 and determines at block 824 whether or not the next consecutive substring in the input message matches a corresponding substring in the template 316 and has a length of at least L (e.g., 16 characters). If not, lossless template-based compression engine 310*a* encodes the message characters of the substring in the output message as literals (i.e., uncompressed) (block 830). In addition, lossless template-based compression engine 310*a* encodes into the output message a jump in the template 316 until a next match, if any, between the original message and template 316 (block 832). The process then returns to block 822.

In response to a determination at block 824 that the next substring in the input message matches the template 316 and has a length of at least L, lossless template-based compression engine 310*a* encodes in the output message a template reference specifying a length equal to the length of the matching substring. The process thereafter returns to block 822. In response to a determination at block 822 that the end of the message has been reached, lossless template-based compression engine 310*a* outputs the compressed message (block 830).

In embodiments of FIG. 8 that do not support dynamic runtime template updates, the process of FIG. 8 ends at block 814 following block 830. In alternative embodiments that support dynamic runtime template updates, lossless template-based compression engine 310*a* may optionally determine whether or not the compression achieved for the input message was poor, for example, by comparing a compression threshold to a compression ratio between the compressed message length and the input message length (block 832). In response to lossless template-based compression engine 310*a* determining that the compression achieved for the input message was not poor, the process given in FIG. 8 ends at block 814. However, in response to a determination at block 832 that the compression achieved from the input message was poor, lossless template-based compression engine 310*a* may optionally update in template stores 312*a* the template 316 utilized to compress the input message (and other messages of the same message type) by again performing longest common subsequence template generation (as described above with reference to block 704 of FIG. 7) for the message type, but with the input message included in the set of sample messages 314 for the message type (block 834). As noted above, any update to a template 316 in template store 312*a* is preferably synchronized with one or more other template stores 312*a* to permit corresponding lossless template-based decompression engines 510*a* of data decompressors 500 to decode future input messages encoded by reference to the updated template 316. Following block 834, the process of FIG. 8 terminates at block 814.

The operation of a hardware or software-based lossless template-based compression engine implementing the compression technique depicted in FIG. 8 may be further understood by reference to the following pseudocode in which M refers to the input message, T refers to the longest common subsequence template, and encode_len is a function that is called to encode the input message. Line numbers are included only for ease of reference.

```
10    len ← 0     //initialize length of matching substring
15    ptr ← 0     //initialize pointer to beginning of T
20    last_ptr ← 0   //initialize previous value of pointer
25    while ((c = fgetc(M) != EOF) //get next character c from M
30       if (c == T[ptr]) //if c matches T, then incr len and ptr
35          len++
40          ptr++
45       else
50          if (len > 0) encode_len(T, ptr, len, last_ptr)
55              // call encode_len at end of matching substring
60          Encode: c as literal //if no match encode c as literal
65    if (len > 0) encode_len(T, ptr, len, last_ptr)
70              //call encode_len at end of M
100   encode_len (T, ptr, len, last_ptr)
105      if (len < 16) Encode: T[ptr–len] to T[ptr–1] as literals
110          //encode matching substring as literals if too short
115      else
120         skip ← ptr – len – last_ptr //compute jump length
125         if (skip > 0) Encode: jump template ptr by skip
130             //encode jump in template in output message
135         Encode: reference to len chars from template T
140             //encode template reference in output message
145         last_ptr ← ptr   //update location in template
150         len ← 0          //reset len for next substring
```

The technique for data compression disclosed in FIG. 8 and in the foregoing pseudocode is elegant and thus is suitable for real-time compression in high performance environments. Further, by qualifying matching substrings with length L (e.g., 16), the compression technique disclosed herein achieves consistently compact results by encoding in the output message only template references sufficiently long so as to improve overall compression. Further, it should be appreciated that the disclosed compression technique advances through the template in a consecutive sequential manner, avoiding complex string matching and template synchronization problems that characterize longest common subsequence schemes. Advancing through the template in this consecutive sequential manner also permits the template jumps (see, e.g., block 832 and pseudocode lines 120-125) and template references (see, e.g., block 840 and pseudocode lines 135-140) to be compactly encoded as only lengths from a present location in the template and without reference to (or relative to) the beginning of the template.

Figure 9:
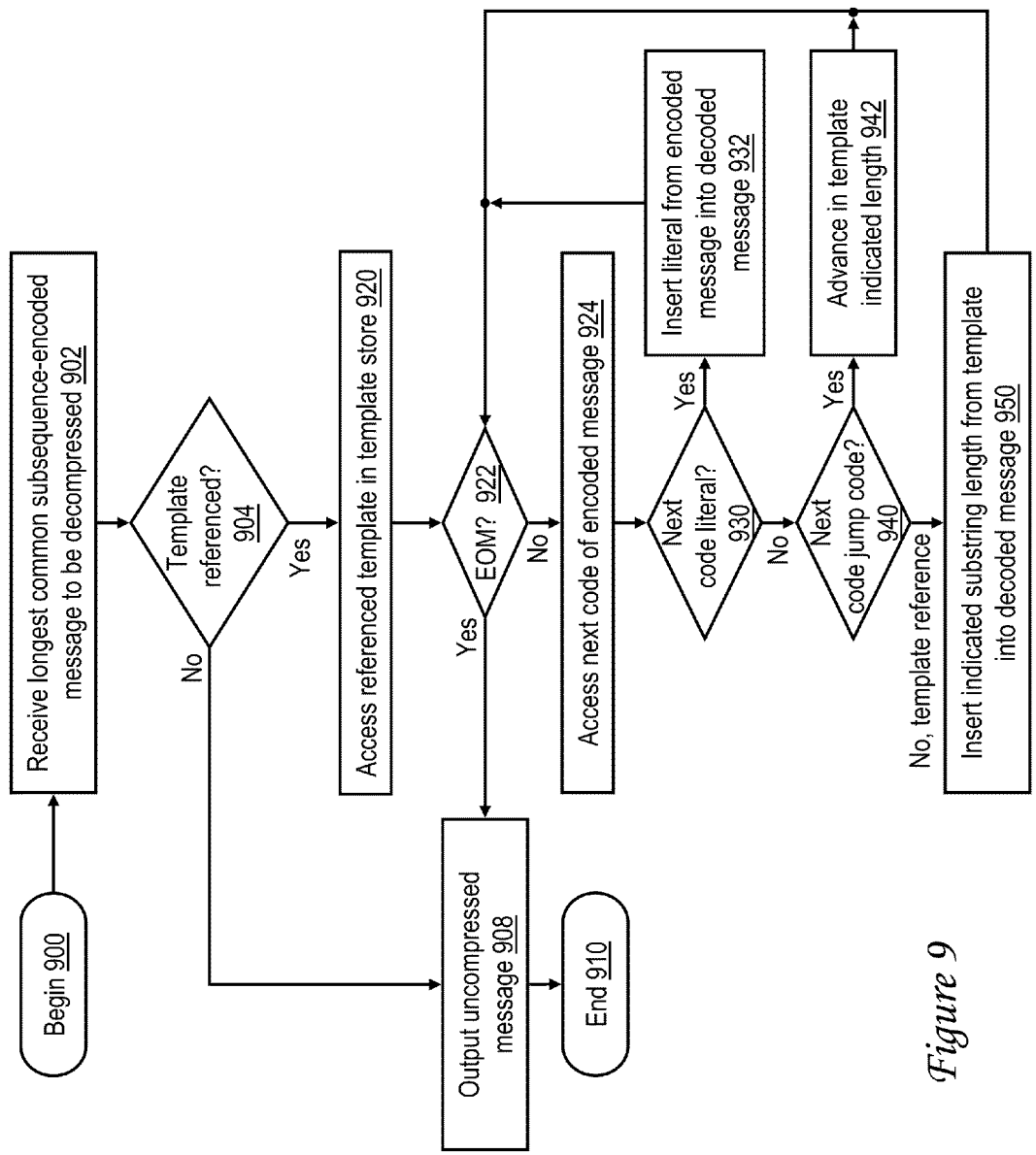
FIG. 9 is a high level logical flowchart of an exemplary process by which a lossless template-based data decompression engine decompresses data in one embodiment.

With reference now to FIG. 9, there is illustrated a high level logical flowchart of an exemplary process by which a data decompression engine decompresses data in one embodiment. The following description assumes for the sake of example that the disclosed decompression technique is implemented by lossless template-based decompression engine 510*a* of data decompressor 500 of FIG. 5; however, it should be appreciated that the disclosed decompression technique can alternatively be utilized in other environments.

The illustrated process begins at block 900 and then proceeds to block 902, which illustrates lossless template-based decompression engine 510*a* of data decompressor 500 receiving a encoded message to be decompressed. At block 904, lossless template-based decompression engine 510*a* determines whether or not the input message references a template 316 in template store 312*a*. If not, lossless template-based decompression engine 510*a* outputs the received message as a string of literals (block 908). Thereafter, the process shown in FIG. 9 ends at block 910.

Referring again to block 904, in response to lossless template-based decompression engine 510*a* detecting a reference to a template 316 in the encoded message (e.g., in the header portion of the encoded message), lossless template-based decompression engine 510*a* accesses the referenced template 316 in template store 312*a* and thereafter decodes the message by reference to the referenced template 316. In particular, lossless template-based decompression engine 510*a* checks at block 922 whether or not the end of the encoded message has been reached. If so, lossless template-based decompression engine 510*a* outputs the decompressed message at block 908, and the process ends at block 910.

Referring again to block 922, in response to a determination that the end of the encoded message has not been reached, lossless template-based decompression engine 510*a* accesses the next consecutive sequential code of the encoded message (block 924). As indicated at blocks 930 and 940, lossless template-based decompression engine 510*a* determines whether the next code is a literal (i.e., uncompressed), a jump code indicating a jump in the template 316, or a template reference specifying a substring of template characters to be copied into the decompressed message. In response to a determination that the next code is a literal, lossless template-based decompression engine 510*a* inserts the literal from the encoded message into the decoded (i.e., decompressed) message (block 932). In response to a determination that the next code is a jump code, lossless template-based decompression engine 510*a* advances in the referenced template 316 by the indicated length (block 942). In response to a determination that the next code is a template reference, lossless template-based decompression engine 510*a* inserts a substring of the specified length from the template 316 into the decoded (i.e., decompressed) message (block 950). Following any of blocks 932, 942 and 950, the process returns to block 922, which has been described.

The operation of a hardware or software-based lossless template-based decompression engine implementing the decompression technique illustrated in FIG. 9 may be further understood by reference to the following pseudocode in which M refers to the encoded message and T refers to the longest common subsequence template. Line numbers are included only for ease of reference.

```
10    ptr ← 0     //initialize ptr to beginning of T
15    while ((code = fgetc(M) != EOF) //get next code from M
20       if (code == 0) Decode: EOB //at end of M
25       if (code size == 2) extra_byte = fgetc(M)
30       if (literal code)Decode: literal //copy code to output
35       else
40          if (jump code) ptr ← ptr + jump //jump ptr in template
45          else
50             if (reference code)Decode: reference(len)
55                 //copy len chars from T[ptr] to T[ptr+len–1]
60             ptr ← ptr + len //advance ptr in T
```

Figure 10:
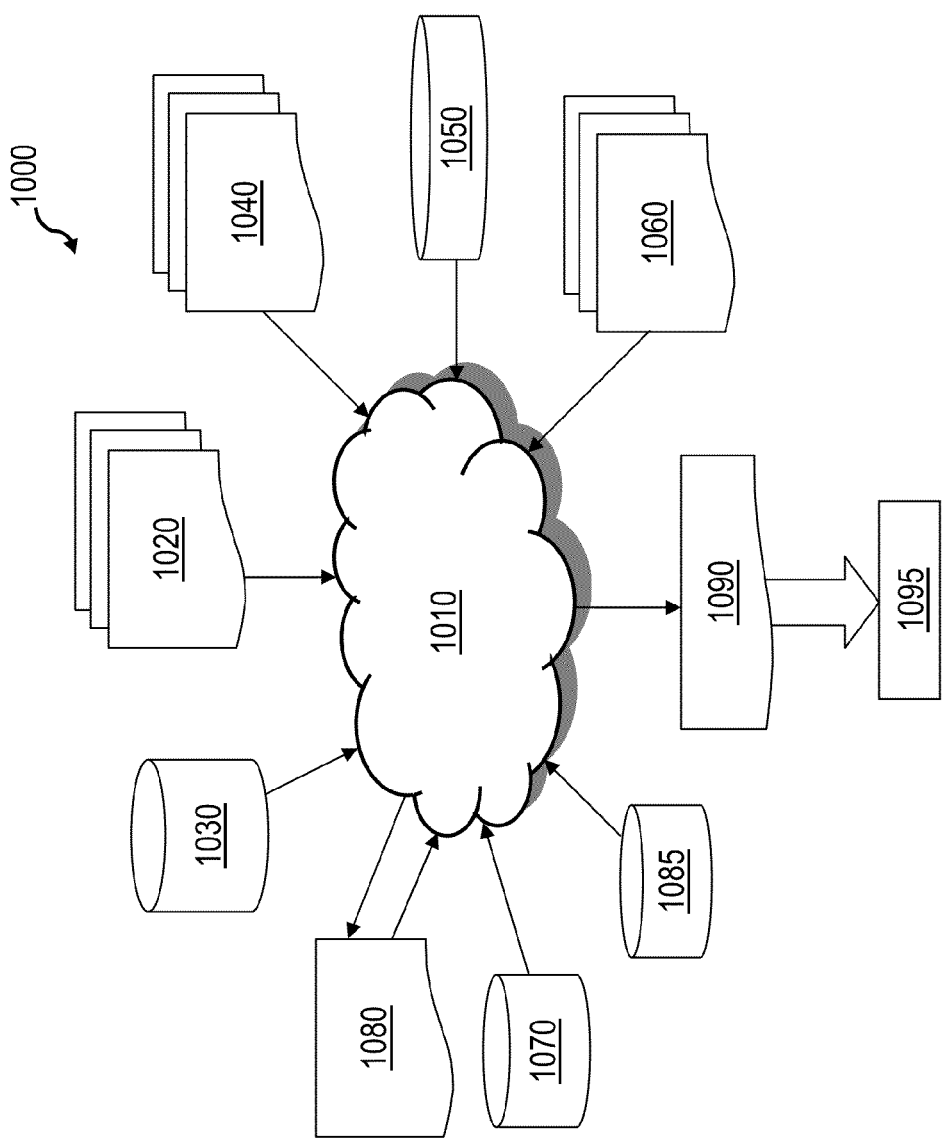
FIG. 10 is a data flow diagram of a design process.

Referring now to FIG. 10, there is depicted a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown in FIGS. 1 and 3-9. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 1 and 3-9. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 1 and 3-9 to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 3-9. In one embodiment, design structure 1090 may comprise a compiled, executable HDL simulation model that functionally simulates the devices shown in FIGS. 1 and 3-9.

Design structure 1090 may also employ a data format used for the exchange of layout data of integrated circuits and/or symbolic data format (e.g., information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 3-9. Design structure 1090 may then proceed to a stage 1095 where, for example, design structure 1090: proceeds to tape-out, is released to manufacturing, is released to a mask house, is sent to another design house, is sent back to the customer, etc.

As has been described, in some embodiments, in response to receiving an input string to be compressed, a plurality of diverse lossless compression techniques are applied to the input string to obtain a plurality of compressed strings. The plurality of diverse lossless compression techniques include a template-based compression technique and a non-template-based compression technique. A most compressed string among the plurality of compressed strings is selected. A determination is made regarding whether or not the most compressed string was obtained by application of the template-based compression technique. In response to determining that the most compressed string was obtained by application of the template-based compression technique, the most compressed string is compressed utilizing the non-template-based compression technique to obtain an output string and outputting the output string. In response to determining that the most compressed string was not obtained by application of the template-based compression technique, the most compressed string is output as the output string.

In at least some embodiments, in response to receipt of an input string, an attempt is made to identify, in a template store, a closely matching template for use as a compression template. In response to identification of a closely matching template that can be used as a compression template, the input string is compressed into a compressed string by reference to a longest common subsequence compression template. Compressing the input string includes encoding, in a compressed string, an identifier of the compression template, encoding substrings of the input string not having commonality with the compression template of at least a predetermined length as literals, and encoding substrings of the input string having commonality with the compression template of at least the predetermined length as a jump distance without reference to a base location in the compression template. The compressed string is then output.

While various embodiments have been particularly shown as described with reference to a preferred embodiment, it will be understood by those skilled in the art that various changes in form and detail may be made therein without departing from the spirit and scope of the claims. For example, although aspects have been described with respect to a computer system executing program code that directs the functions of the present invention, it should be understood that present invention may alternatively be implemented as a program product including a computer-readable storage device (e.g., volatile or non-volatile memory, optical or magnetic disk or other statutory manufacture) that stores program code that can be processed by a data processing system. Further, the term "coupled" as used herein is defined to encompass embodiments employing a direct electrical connection between coupled elements or blocks, as well as embodiments employing an indirect electrical connection between coupled elements or blocks achieved using one or more intervening elements or blocks.

What is claimed is:

1. A method of data processing system in a data processing system, comprising:

in response to receipt of an input string, an integrated circuit attempting to identify, in a template store, a closely matching template for use as a compression template;

in response to identification of the closely matching template as the compression template, the integrated circuit compressing the input string into a compressed string by reference to a compression template, wherein the compressing includes:

encoding, in a compressed string, an identifier of the compression template;

encoding, in the compressed string, first substrings of the input string not having commonality with the compression template of at least a predetermined length as literals;

in response to identifying first substrings, encoding, in the compressed string, jump lengths in the compression template until a next match between the input string and the compression template;

encoding, in the compressed string, second substrings of the input string having commonality with the compression template of at least the predetermined length as a template reference without reference to a base location in the compression template; and outputting the compressed string.

2. The method of claim 1, and further comprising building the compression template from a longest common subsequence of a plurality of sample messages.

3. The method of claim 1, and further comprising:

in response to a failure to identify a closely matching template in the template store, outputting the string uncompressed.

4. The method of claim 3, and further comprising:

in response to a failure to identify a closely matching template in the template store, adding a new template generated from the input string to the template store.

5. The method of claim 1, wherein the input string comprises a text message.

6. The method of claim 1, and further comprising:

in parallel with the compressing, applying a plurality of diverse lossless compression techniques to the input string to obtain a plurality of compressed strings including the compressed string, wherein the plurality of diverse lossless compression techniques include a non-template-based compression technique;

selecting a most compressed string among the plurality of compressed strings;

determining whether or not the most compressed string was obtained by template-based compression; and in response to determining that the most compressed string was obtained by template-based compression, recompressing the most compressed string utilizing the non-template-based compression technique to obtain an output string and outputting the output string.

7. The method of claim 1, and further comprising receiving and decoding the output string, wherein the decoding includes:

accessing the compression template identified in the compressed string; and until an end of the compressed string is reached, repeatedly performing:

determining whether a next code in the compressed string is a literal, a jump code or a reference code; and in response to determining the next code is a literal, inserting the code in a decompressed string;

in response to determining the next code is a jump code, advancing in the compression template a length specified by the jump code; and in response to determining the next code is a reference code, inserting in the decompressed string a next consecutive substring from the compression template of a length specified by the reference code; and outputting the decompressed string.

8. A method of data processing, the method comprising:

in response to receiving a compressed string, an integrated circuit decoding the compressed string, wherein the decoding includes:

accessing a compression template identified in the compressed string; and until an end of the compressed string is reached, repeatedly performing:

determining whether a next code in the compressed string is a literal, a jump code or a reference code; and in response to determining the next code is a literal, inserting the code in a decompressed string;

in response to determining the next code is a jump code, advancing in the compression template a length specified by the jump code; and in response to determining the next code is a reference code, inserting in the decompressed string a next consecutive substring from the compression template of a length specified by the reference code; and outputting the decompressed string.

* * * * *